(12) United States Patent
Hirshberg

(10) Patent No.: US 11,381,145 B2
(45) Date of Patent: Jul. 5, 2022

(54) STEP MOTOR

(71) Applicant: David Hirshberg, Haifa (IL)

(72) Inventor: David Hirshberg, Haifa (IL)

( * ) Notice: Subject to any disclaimer, the term of this patent is extended or adjusted under 35 U.S.C. 154(b) by 361 days.

(21) Appl. No.: 16/805,852

(22) Filed: Mar. 2, 2020

(65) Prior Publication Data

US 2021/0273544 A1  Sep. 2, 2021

(51) Int. Cl.
*H02K 37/00* (2006.01)
*H01L 41/332* (2013.01)
*H01L 41/09* (2006.01)

(52) U.S. Cl.
CPC ........... *H02K 37/00* (2013.01); *H01L 41/096* (2013.01); *H01L 41/332* (2013.01)

(58) Field of Classification Search
None
See application file for complete search history.

(56) References Cited

U.S. PATENT DOCUMENTS

| 2013/0255427 A1* | 10/2013 | Mizushima | H02N 2/103 310/323.16 |
| 2014/0323837 A1* | 10/2014 | Hirshberg | A61B 5/6848 604/117 |

* cited by examiner

*Primary Examiner* — Benjamin P Sandvik

(57) ABSTRACT

A linear or rotary step motor for moving an object comprising: one or more beam actuators; and one or more auxiliary actuators. Each beam actuator comprises: (a) a flexible beam; (b) two holders holding the flexible beam from the beam edges; and (c) an actuator for moving the said at least one holder in order to bent the beam toward the object or to pull the beam away from the object. The axillary actuators are connected to the one or more beam actuators. The beam actuators configured to grip or release the object, and the one or more beam actuators perform a movement step to the object by first grip the object by the one or more beam actuators then push the object by activating the auxiliary actuator.

20 Claims, 10 Drawing Sheets

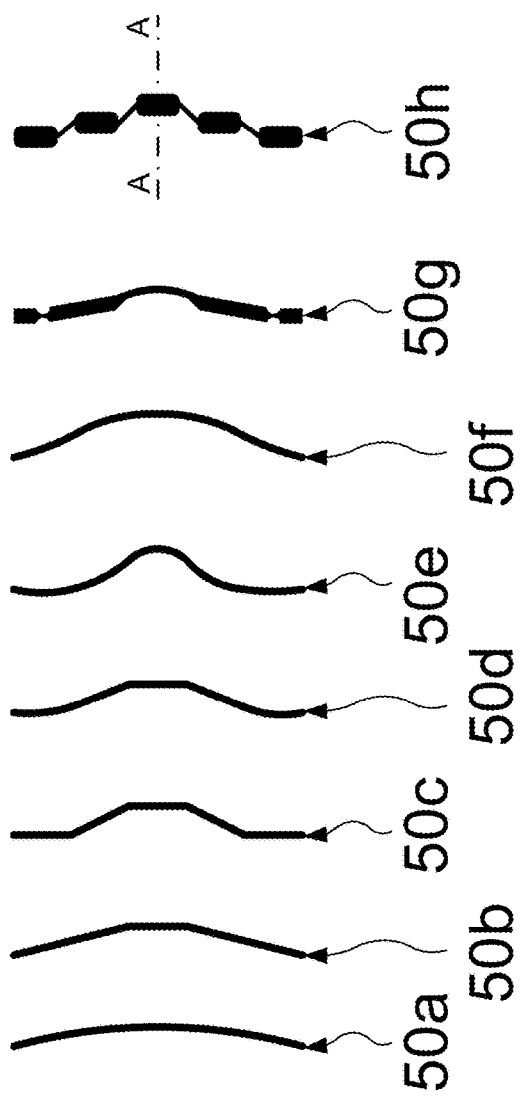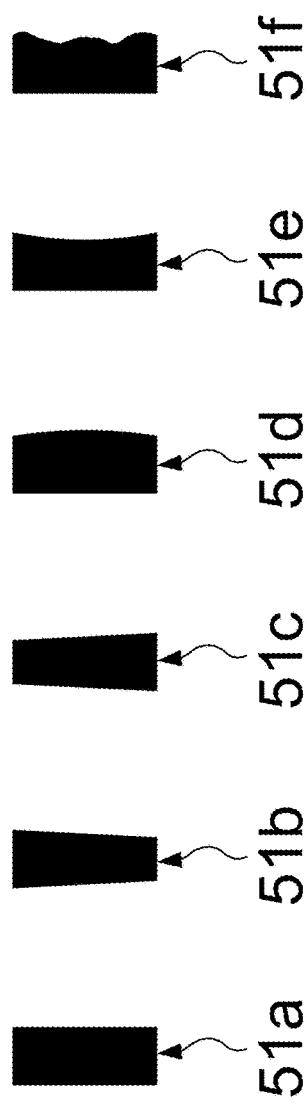

STEP MOTOR

FIELD AND BACKGROUND OF THE INVENTION

The present invention, in some embodiments thereof, relates to step motors, and more particularly, but not exclusively, to micro-electro-mechanical system, (MEMS), step motor.

step motor is a motor that creates motion in steps. The motion can be linear motion, i.e., in a straight line, or rotary motion, i.e., in a circular line. The object that is moved by the motor may take many shapes. Typically for linear step motor, the object shape will be an elongated bar, and for rotary step motor, the object shape will be a wheel or a disk. Typically, a step motor is comprising from a plurality of actuators that moves the object. The connection type between the actuators and the object which is being moved is important element in the motor design, especially when the contact is not permanent and a plurality of contact and release cycles are performed. This design element is more important in miniature step motor, in general, and in micro-electro-mechanical system (MEMS) step motor, in specific. An objective of the invention is to provide an improved way to make a contact between the motor's actuators and the object.

The demand for miniature step motors are increasing as more and more MEMS chips are provided for application such as lab-on-a-chip, miniature disk-drive (disk-on-a chip), bio-MEMS chips, fluidic MEMS chips, miniatures valves and the like.

SUMMARY OF THE INVENTION

According to an aspect of some embodiments of the present invention there is provided a step motor that move objects in incremental step using flexible beams that grip and release the object.

According to an aspect of some embodiments of the present invention there is provided a step motor for moving an object comprising:—one or more beam actuators; and—one or more auxiliary actuators, each beam actuator comprises: (a) a flexible beam; (b) two holders holding the beam from the beam edges; and (c) an actuator for moving the at least one holder in order to bent the beam toward the object or to pull the beam way from the object, wherein the one or more axillary actuators are connected to the one or more beam actuators, the one or more beam actuators configured to grip or release the object, and the one or more beam actuators perform a movement step to the object by first grip the object by the one or more beam actuators then push the object by activating the auxiliary actuator.

According to some embodiments of the invention the actuator is configured to move both holders.

According to some embodiments of the invention the step motor is linear step motor.

According to some embodiments of the invention the step motor is rotary step motor.

According to some embodiments of the invention the object is a needle.

According to some embodiments of the invention the step motor is fabricated on a die.

According to some embodiments of the invention the a plurality of the step motors are fabricated on a single die.

According to some embodiments of the invention the object is further fabricated on the die.

According to some embodiments of the invention the step motor further comprises one or more drivers that drives electrical signals to activate the actuator.

According to some embodiments of the invention the step motor further comprises a controller, wherein the controller command the drivers and activate the beam actuators and the auxiliary actuators in a sequence of commands that is suitable to move the object.

According to some embodiments of the invention the step motor is fabricated on a first die, and the controller and the one or more drivers are fabricated on a second die and the dies are bonded back to back to each other by wafer bonding technics.

According to some embodiments of the invention the second die comprises at least on of or the combination of (1) sensors, (2) power subsystem, and (3) communication subsystem.

According to some embodiments of the invention the beam comprises from a plurality of straight segments.

According to some embodiments of the invention the beam cross section shape is not rectangular.

According to some embodiments of the invention the actuator of the beam actuator is any one of or any combination of (1) electro-static actuator, (2) electro-magnetic actuator, (3) thermal actuator, and (4) piezoelectric actuator.

According to some embodiments of the invention the axillary actuator is comprises of any one of or any combination of (1) electro-static actuator, (2) electro-magnetic actuator, (3) thermal actuator, and (4) piezoelectric actuator.

According to some embodiments of the invention the actuator of the beam actuator comprises one or more piezoelectric cantilevers.

According to some embodiments of the invention the step motor comprising a layer of piezoelectric material with electrodes above and below the layer.

According to some embodiments of the invention the step motor is fabricated by a method comprising: deposit sacrificial layer over a substrate; deposit conducting layer over the sacrificial layer; deposit piezoelectric layer over the conducting layer; etch a geometrical pattern of the one or more beam actuators and one or more auxiliary actuator using a mask created by lithography process; and etch the sacrificial layer under one or more one or more beam actuators and one or more auxiliary actuator.

According to some embodiments of the invention the step motor is fabricated by a fabricating method comprising: deposit piezoelectric layer; etch a geometrical pattern of the one or more beam actuators and one or more auxiliary actuator using a mask created by lithography process; and etch the top surface of the substrate under the one or more beam actuators and one or more auxiliary actuator using a two stage SCREAM etching process comprising: first, vertical anisotropic dry etching of pattern of pores, and second, horizontal extension of the pores etching using wet or gas etching.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, some hardware for performing selected tasks according to embodiments of the invention, if not explicitly specified, could be implemented as a chip or a circuit. As software, selected tasks according to embodiments of the invention could be implemented as a plurality of software instructions being executed by a computer or controller using any suitable operating system. In an exemplary embodiment of the invention, one or more tasks according to exemplary embodiments of method and/or system as described herein are performed by a processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1A-FIG. 2B are illustrating several versions of a simplified construction and operation of a single contact element, hereinafter beam actuator, according to the present invention;

FIG. 1A is an illustration of beam actuator with two moving holders;

FIG. 2A is an illustration of beam actuator another beam actuator with two moving holders;

FIG. 2A is an illustration of beam actuator another beam actuator with one moving holder and one fixed holder;

FIG. 3A is a top view of a linear step motor;

FIG. 3B is a of a linear step motor;

FIG. 5 is a top view of varies shape of the beams in accordance with the present invention;

FIG. 6 is a cross-sectional views of the varies cross-section shapes of the beam;

FIG. 11A is a top view of the piezoelectric cantilever;

FIG. 11B is a side view of the piezoelectric cantilever;

FIG. 11C is a top view of the piezoelectric cantilever illustrating the dynamics of the bending of the cantilever;

FIG. 14A is an isometric view from top left side;

FIG. 14B is an isometric view from bottom right side;

FIG. 15A is a top view of the fabricated apparatus;

FIG. 15B is cross section side view across line H-H designated in FIG. 15A of a desired final fabricated apparatus.

FIG. 15C-FIG. 15K are cross section side view across line H-H designated in FIG. 15A of the fabricated apparatus after the first to ninth stages respectively; and FIG. 15L is a cross section side view across line H-H designated in FIG. 15A of the fabricated apparatus after the last stage in an alternative process.

DESCRIPTION OF SPECIFIC EMBODIMENTS OF THE INVENTION

Figure 1A:
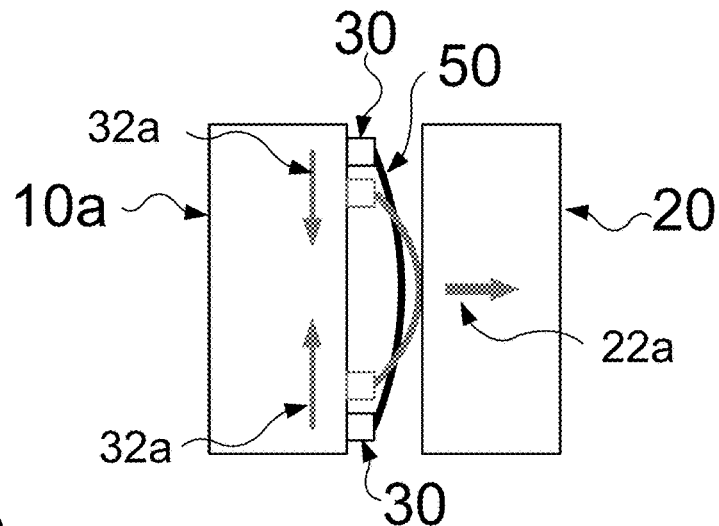

The present invention, in some embodiments thereof, relates to step motors, and more particularly, but not exclusively, to micro-electro-mechanical system, (MEMS), step motor.

step motor is a motor that creates motion in steps. The motion can be linear motion, i.e., in a straight line, or circular motion, i.e., in a circular line. The shape of the object that is moved by the motor may take many shapes. Typically for linear step motor, the object shape will be an elongated bar, and for circular step motor, it will be a wheel or disk. Typically, a step motor is comprising from a plurality of actuators that moves the object. The connection type between the actuators and the object which is being moved is important element in the motor design, especially when the contact is not permanent and a plurality of contact and release cycles are performed. This design element is even more important in miniature motor in general and micro-electro-mechanical system (MEMS) step motor in specific. An objective of the invention is to provide an improved way to make a contact between the motor's actuators and the object.

The demand for miniature step motors are increasing as more and more MEMS chips are provided for application such as lab-on-a-chip, miniature disk-drive (disk-on-a chip), bio-MEMS chips, fluidic MEMS chips, miniatures valves and the like.

One problem facing a developer of MEMS step motor is that the displacements of the actuators are limited and the fabrication inaccuracy of the object and the actuators are large relative to the geometries of fabricated elements.

As used herein, the term "step motor" or in short "motor" means an arrangement of mechanical elements and electrical circuitry that moves an object in repetitive small increments.

As used herein, the term "object" means a solid object, optionally, connected or attached to another parts or elements, that is moved by the step motor.

As used herein, the term "linear step motor" means a step motor that moves the object in a straight line, and the term "rotary step motor" means a step motor that moves the object in rotary motion.

As used herein, the term "die" means a rectangle chip fractured from a semiconductor wafer and manufactured in semiconductor foundry by semiconductor fabrication processes. The term "chip" and the term "die" are alternately used in this application and essentially mean the same. Note that the die is not necessarily made of semiconductor material rather is manufactured using facilities that are usually used to fabricated semiconductors dies.

As used herein, the term "substrate" means the material layer the wafer is made of which all additional layers and structure are fabricated on top of it.

The present invention teaches fabrication of a miniature step motor that is typically fabricated in MEMS Micro or Nano fabrication process or methods which are used in semiconductors foundries and research clean room facilities. However, it will be apparent to those skilled in the art, wherever it is appropriate, the step motor with proper modifications may be fabricate in other fabrication or manufacturing processes and facilities and with varies different variants and sizes.

The present invention teaches that the object and the step motor actuators are integrated into a single die or multi die structure using semiconductor fabrication techniques. Both the object and the mechanical subsystem are fabricated using semiconductor fabrication techniques allowing achieving, among other things, relatively large movement of very small objects.

Another advantage of the present invention is the ability to manufacture, with a low cost, a plurality of objects and step motors on a single chip or die.

Before explaining at least one embodiment of the invention in detail, it is to be understood that the invention is not necessarily limited in its application to the details of construction, fabrication techniques and the arrangement of the components and/or methods set forth in the following description and/or illustrated in the drawings and/or the Examples. The invention is capable of other embodiments or of being practiced or carried out in various ways.

Figure 1B:
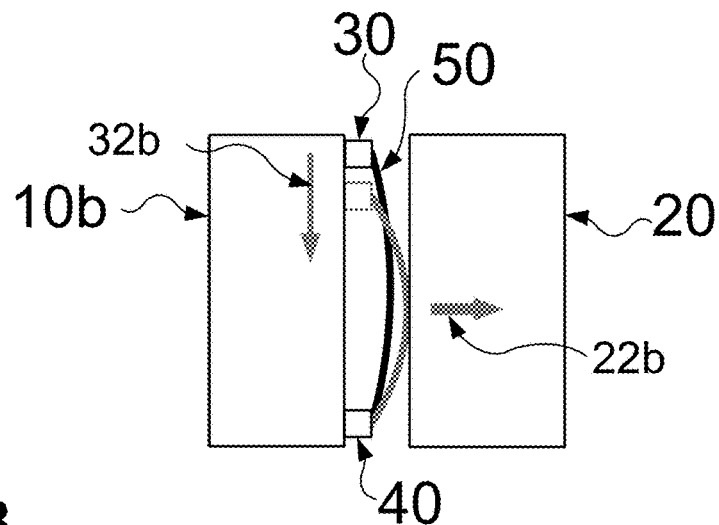
FIG. 1B is an illustration of beam actuator with one moving holder and one fixed holder.
Figures 2A, 2B:
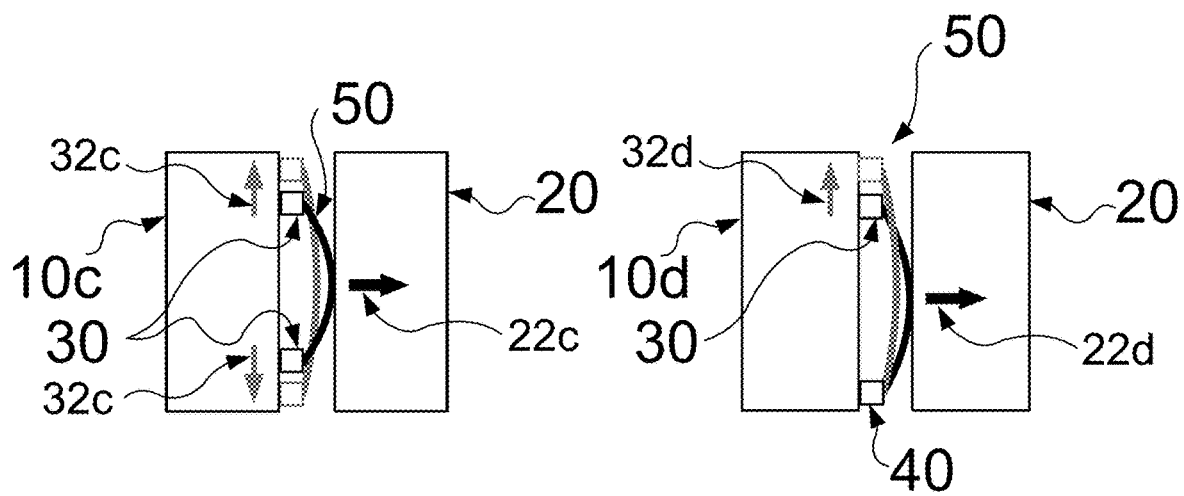

For purposes of better understanding some embodiments of the present invention, as illustrated in FIGS. 1-15 of the drawings, reference is first made to FIG. 1 and FIG. 2. FIGS. 1A, 1B, 2A and 2B illustrate a simplified construction and operation of a single contact element, hereinafter beam actuator, according to the present invention.

Reference is made now to FIG. 1A. FIG. 1A illustrates a beam actuator 10a with two moving holders 30. Holder 30 are connected to the two the edges of a beam 50. Beam 50 is made from flexible material and is configured to bent when holders 30 move. The movement direction of holder 30 is illustrated by grey arrows 32a. The inactive state of holders 30 and beam 50 are illustrated by drawing the holders and the beam in black color. The active state of holders 30 and beam 50, after holders 30 movement, is illustrated by drawing the holders and the beam in grey color. In the active state, beam 50 comes into contact with an object 20. Object 20 is the element that the step motor is configured to move. In linear step motor object 20 is typically an elongated bar and in a rotary step motor object 20 will typically be a disk or cylinder, sometimes refer as the rotor of the motor. Assuming, for a moment, that object 20 is fixed, in this to case, the beam is pressing object 20 in the direction represented by grey arrow 22a. Due to the flexibility of beam 20, the contact surface between beam 50 and object 20 will tend to be maximized and beam 20 will be flatten or tighten and match itself to the curves, inaccuracy, roughness, and the like of object 20. In an exemplary embodiment of the invention, beam 30 is made of metals, such as, aluminum, nickel, silver, copper, gold, iron, titanium, cobalt, etc. Alternatively beam 30 is made of metal alloys, metal oxide, metal nitride, semiconductor materials, such as, silicon or poly silicon, semiconductor materials oxides, semiconductor materials, and the like. In addition, beam 30 may be formed of ceramics, polymers or any other material with strength, flexibility and other mechanical materials that fit the specific step motor design goals. The maximal displacement of the beam dictates the maximal gap between the object and the beam during fabrication. Since, the longer the beam, the greater the achieved maximal displacement of the beam for the same holder displacement this arrangement can trade between design fabrication constrains and length of the bean.

Reference is made now to FIG. 1B. FIG. 1B illustrates a beam actuator 10b with one moving holder 30 and one fixed holder 40. Holders 30 and 40 are connected to the two the edges of a beam 50. Beam 50 is made from flexible material and is configured to bent when holder 30 moves. The movement direction of holder 30 is illustrated by grey arrows 32b. The inactive state of holder 30 and beam 50 is illustrated by drawing this elements in black color, while the active state, after holder 30 movement, is illustrated by drawing the elements in grey color. The operation is essentially similar to the actuator in FIG. 1A. In the active state, beam 50 comes into contact with an object 20. When several actuators are connected to each other to create more complex movement operation, it is, in some cases, preferable to use actuators 10b over actuator 10a.

Reference is made now to FIGS. 2A and 2B. FIGS. 2A and 2B illustrate another embodiments of beam actuators, beam actuators 10c and 10d respectively. Actuators 10c and 10d are similar to actuators 10a and 10b with a dissimilarity that the beams in actuators 10c and 10d are in contact with the object in the inactive state and as the moving holder(s) pull the beam away and disconnect the beam from the object. In FIG. 2A actuator, 10c comprises two moving holders 30 connected to the two the edges of a beam 50. In inactive state, beam 50 is pressed against object 20 in the direction represented by black arrow 22c. In active state holders 30 move in the direction illustrated by arrows 32c and beam 50 is disconnected from object 20.

In FIG. 2B, actuator 10d comprises one moving holder 30 and one fixed holder 40 connected to the two the edges of a beam 50. In inactive state, beam 50 is pressed against object 20 in the direction represented by black arrow 22d. In active state holder 30 move in the direction illustrated by arrows 32d and beam 50 is disconnected from object 20.

As used herein, the term "inactive state", mentioned hereinabove, is the resting state when the actuator do not supplied with electric power. The terms "inactive state", "resting state", "initial state" and "off state" may be used interchangeably in this document and essentially mean the same.

As used herein, the term "active state", mentioned hereinabove, is the operative state when the actuator supplied with electric power and controlled to act. The terms "active state", "operating state", "final state" and "on state" may be used interchangeably in this document and essentially mean the same.

As used herein, the term "grip state" means active state if the beam actuator is from type 10a or 10b and means inactive state if the beam actuator is from type 10c or 10d.

As used herein, the term "release state" means inactive state if the beam actuator is from type 10a or 10b and means active state if the beam actuator is from type 10c or 10d.

As used herein, the term "beam actuator" means the complex presented hereinabove in FIGS. 1A, 1B, 2A and 2B that comprises an actuator (10x), two holders (30+30 or 30+40) and a beam (50).

As used herein, the term "actuator" means an element or a component or a circuit or a complex of elements that configured to mechanically move or displace another element, e.g., a holder.

In an exemplary embodiment of the invention, the step motor is fabricated on a die using MEMS fabricated processes. To achieve a freedom to move of the actuator and object they may be fabricated on top of a thin temporary sacrificial layer (for example silicon oxide layer) that is etched away after motor fabrication. Alternatively, the motor structure is freed using partial etching of the substrate in processes like MEMS SCREAM process or by etching the substrate for the bottom side.

Figure 3A:
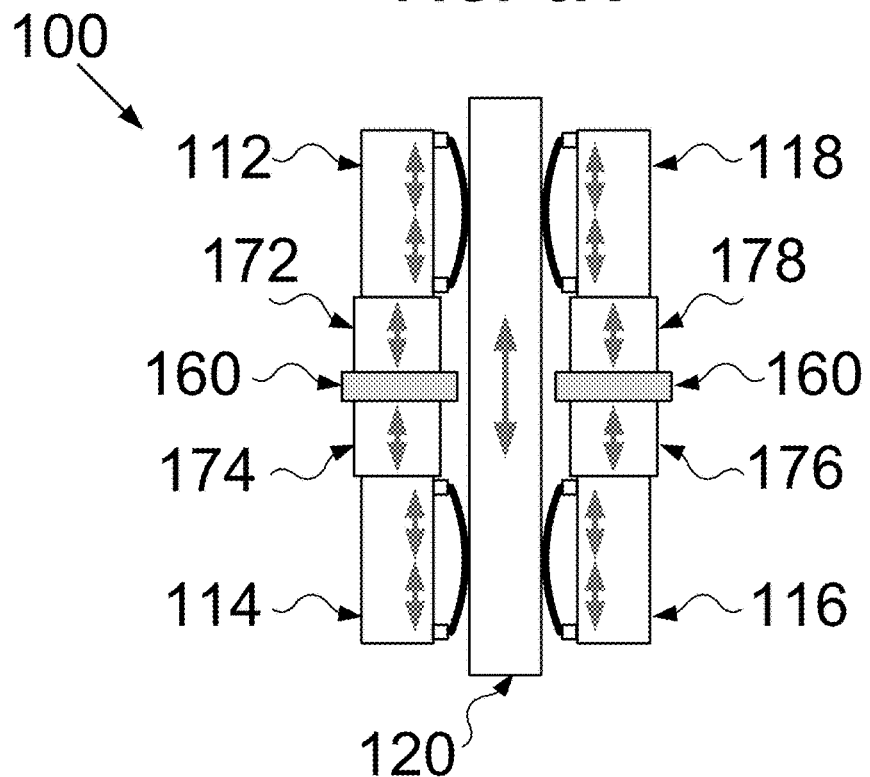
FIG. 3A-FIG. 3B are illustrations of exemplary embodiments of step motor architectures with the beam actuators presented in FIGS. 1A-1D in accordance with the present invention.
Figure 3B:
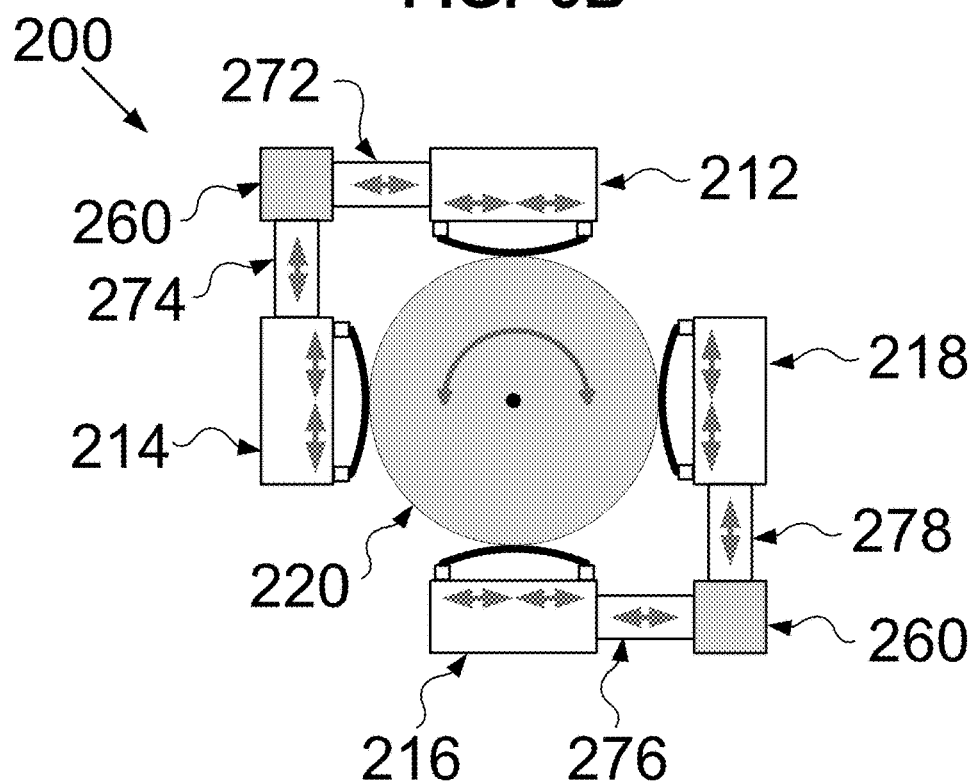

Reference is made now to FIG. 3A and FIG. 3B. FIG. 3A and FIG. 3B illustrate exemplary embodiments of step motor architectures with the beam actuators presented in FIGS. 1A-1D. In FIG. 3A, a linear step motor 100 is illustrated. Four beam actuators 112, 114, 116 and 118 are used to grip an elongated bar object 120. The beam actuators 112, 114, 116 and 118, hereinafter 11x, may be from any type of beam actuator 10x presented above. This is illustrated by the grey two-ways arrows drawn on the beam actuators. Each one of the two holders in each beam actuator may be fixed holder or moving holder. Each moving holder can move inwards to push the beam towards the object or move outwards to pull the beam from the object. If the beam actuators are from types 10c or 10d, object 120 will be griped by the beam actuators 11x when there is no power supply to motor 100. If the beam actuators are from types 10a or 10b, object 120 will be released and free to move when there is no power supply to step motor 100. Motor 100 is fixed to an external article by two anchors 160. In an exemplary embodiment of the invention, anchors 160 are connected to a substrate. Alternatively, anchors 160 are connected to an apparatus or a device of which motor 100 is a part thereof. The left side anchor 160 is connected to auxiliary actuators 172 and 174. The right side anchor 160 is connected to auxiliary actuators 176 and 178. Auxiliary actuators 17x are connected each to beam actuators 11x respectively, and they can move beam actuators 11x up and down relative to anchors 160 as illustrated by the grey arrows drawn on auxiliary actuators 17x.

Before motor 100 starts to move object 120, all beam actuators 11x are in grip state and object 120 is locked by the four beams that press object 120 in four different contact areas. Linear step motor 100 create downwards motion using a motor controller that generates a specific sequence of commands to actuators 11x and 17x as describe below. In the first step, beam actuators 112 and 118 are set to grip state and beam actuators 114 and 116 are set to release state so that object 120 is hold only by beam actuators 112 and 118. Next, auxiliary actuators 172 and 178 contract, i.e., pull beam actuators 112 and 118 downwards. Since auxiliary actuators 172 and 174 are anchored to the substrate and beam actuators 112 and 118 grip object 120, object 120 is moved downwards. Next, beam actuators 114 and 116 are set to grip state to hold object 120. Next, beam actuators 112 and 118 are set to release state, therefore they release their grip from object 120. The next step is to command expanding of auxiliary actuators 174 and 176, Since now object 120 is held by beam actuators 114 and 116, expanding auxiliary actuators 174 and 176 moves object 120 downwards as well. This cycle can continue by alternatingly holding object 120 by the upper beam actuators 112 and 118 and the lower beam actuator 114 and 116 and contract and expand auxiliary actuators 17x accordingly. This sequence of commands to the actuators proceed as long as the controller required to move object 120 further downwards.

In order to move object 120 upwards, a similar sequence is applied but now the controller contracts auxiliary actuators 174 and 176 when beam actuators 114 and 116 grip object 120 and expands auxiliary actuators 172 and 178 when beam actuators 112 and 118 grip object 120.

The actual distance object 120 travels may be precisely set by the controller by counting the incremental movement steps, Additionally or alternatively, one or more movement sensor are coupled with the controller and the distance object 120 is traveled may be controlled by using a close loop control subsystem. The speed of the movement may be set by setting the number of incremental movement steps per unit of time. For example, generating 1000 steps per second when each step is micrometer produce speed of 1 mm/sec while generating 5000 steps per second produce speed of 5 mm/sec. Additionally or alternatively, one or more speed sensor are coupled with the controller and the speed of object 120 may be controlled by using a close loop control subsystem.

This structure of linear step motor is only one possible structure, other structures of linear step motor with less beam actuators or more beam actuators and with different geometries may be apparent to those skilled in the art. This step motor mechanism may also be used as vibrating element. In case auxiliary actuators 17x are reciprocal and can sense stress waves or vibration applied to object 120, an acoustic wave sensor or imager, may be provided by this motor embodiments as well.

Reference is made now to FIG. 3B. FIG. 3B illustrates a top view of an exemplary embodiment of rotary step motor 200 with the beam actuators presented in FIGS. 1A-1D. Rotary step motor 200 comprises four beam actuators 212, 214, 216 and 218. Motor 200 configured to rotate a disk object 220 that revolves around a central axis. Beam actuators 212, 214, 216 and 218 are located on the four sides of the disc object 220. And ach beam actuator 212, 214, 216 or 218 may grip or release disk object 220 upon a command from a motor controller. The beam actuators 212, 214, 216 or 218, hereinafter 21x, may be from any type of beam actuator 10x, i.e., 10a, 10b, 10c or 10b, presented above. This is illustrated by the grey two-ways arrows drawn on the beam actuators. Each one of the two holders in each beam actuator may be fixed holder or moving holder. Each moving holder can move inwards to push the beam towards the object or move outwards to pull the beam from the object.

Rotary step motor 200 is fixed to an external article by two anchors 260. In an exemplary embodiment of the invention, anchors 160 are connected to a substrate. Alternatively, anchors 160 are connected to an apparatus or a device of which motor 200 is a part thereof. The up-left side anchor 260 is connected to auxiliary actuators 272 and 274. The down-right side anchor 260 is connected to auxiliary actuators 276 and 278. Auxiliary actuators 27x are connected each to beam actuators 21x respectively, and they can move beam actuators 21x up, down, right or left relative to anchors 260 as illustrated by the grey to-ways arrows drawn on a auxiliary actuators 27x.

Rotary step motor 200 create rotary motion using a motor controller that generates a specific sequence of commands to actuators 21x and 27x as describe below.

At first, all beam actuators 21x are in grip state and object 220 is locked by the four beams that press object 220 in four different contact areas. In the next step, beam actuators 212 and 216 are set to grip state and beam actuators 214 and 218 are set to release state so that object 220 is hold only by beam actuators 212 and 216. Next, auxiliary actuators 272 and 276 expand, i.e., push beam actuators 212 and 216 clock-wise relative to object 220. Since auxiliary actuators 272 and 276 are anchored to the substrate and beam actuators 212 and 216 grip disk object 220, disk object 220 is rotated clock-wise. Next, beam actuators 214 and 218 are set to grip state to hold disk object 220. Next, beam actuators 212 and 216 are set to release state, therefore they release their grip from object 220. In the next step, the controller commands auxiliary actuators 274 and 278 to expand. Since now object 220 is held by beam actuators 214 and 218, expanding auxiliary actuators 274 and 278 rotates object 220 clock-wise as well. This cycle can continue by alternatingly holding object 220 by beam actuators 214 and 218 and beam actuator 212 and 216 and contract and expand auxiliary actuators 27x accordingly. This sequence of command to the actuator proceed as long as the controller required to rotate object 220 further clock-wise.

In order to rotate object 220 counter-clock-wise, a similar sequence is applied but now the controller expands auxiliary actuators 274 and 278 when beam actuators 214 and 218 grip object 220 and contracts auxiliary actuators 272 and 276 when beam actuators 212 and 216 grip object 220.

As used herein, the term "auxiliary actuator" means an actuator that is connected to beam actuator and configured to move the beam actuator.

The actual angular distance object 220 rotates may be precisely set by the controller by counting the incremental rotational steps, Additionally or alternatively, one or more angular position sensor are coupled with the controller and the angular distance object 220 is rotated may be controlled by using a close loop control subsystem. The angular speed may be set by setting the number of incremental rotational steps per unit of time. For example, generating 3600 steps per second when each step is one degree produce rotational speed of 1 round per second, while generating 36000 steps per second produce rotational speed of 10 rounds per second. Additionally or alternatively, one or more rotational speed sensor are coupled with the controller and the speed of object 220 may be controlled by using a close loop control subsystem.

This structure of rotary step motor is only one possible structure, other structures of rotary step motor with less beam actuators or more beam actuators and with different geometries may be apparent to those skilled in the art. For example, it is sufficient to have only one beam actuator that can be located anywhere tangential to the disk object 220 and by having the beam actuator in grip state move clock-wise or counter-clock-side the moved to its release state and make this action repeatedly object 220 will rotate. The drawback of this configuration is that in case of external resistance to rotation object 220 may suffer from back-lash in motion.

Figure 4:
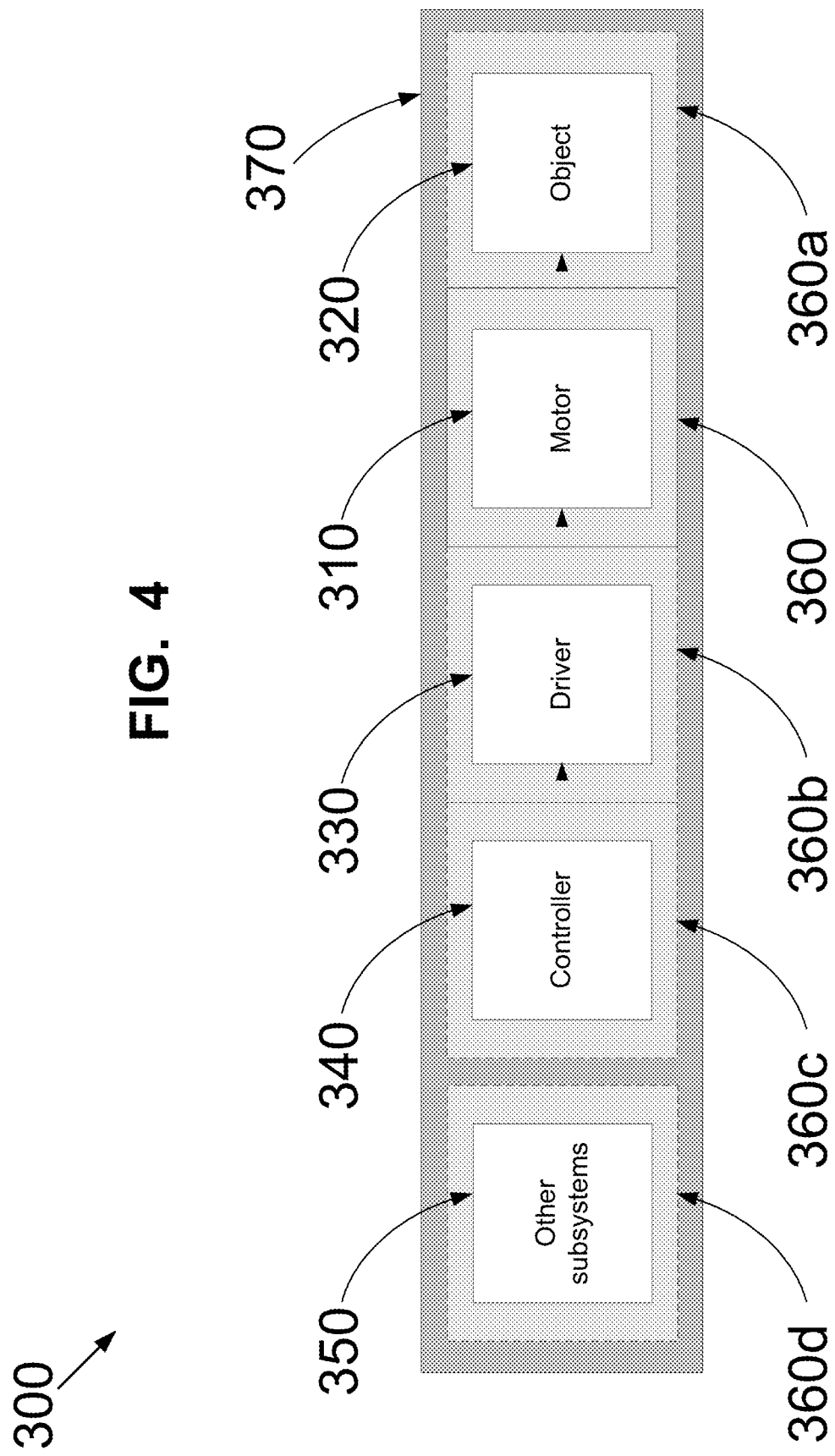
FIG. 4 is a block diagram of a motor-system-on-a-chip in accordance with the present invention.

Reference is made now to FIG. 4. FIG. 4 illustrates a block diagram of a motor-system-on-a-chip in accordance with the present invention. Motor 310 is a step motor in any configuration of a step motor in accordance to the present invention. Motor 310 is fabricated on a die 360 using semiconductor fabrication processes as further discussed later on. Optionally, motor 310 is attached and configured to move object 320 in accordance to the present invention. Alternatively, the object is not fabricated on die 360 and it is coupled with motor 310 after fabrication. The coupling may be done in assembly stage of an apparatus comprising motor 310, or after the apparatus delivery to the client, before or during the apparatus operation. Die 360 may comprises a single motor 310 or a plurality of motors 310. In case a plurality of motors 310 are fabricated in die 360, a plurality of objects 320 may be fabricated as well. Motor 310 operates in according to electrical signals driven from driver 330.

Driver 330 drives current or voltage signals to activate motor 310. Optionally, driver 330 drives multiple signals to activate motor 310. Optionally, driver 330 drives complex signaling like sine waves, pulse waves or any complex time function signals to activate motor 310. Optionally, driver 330 drives digital signaling to activate motor 310. Typically, driver 330 is implemented using analog electronic elements such as transistors. As used herein, the term "driver" means an element or a component or a circuitry or a complex of elements that configured to electrically signaling and controlling a motor operation.

Motor-system-on-a-chip 300 optionally comprises a controller 340 and one or more other subsystems 350 that are related to the system operation. The motors 310 in system 300 are controlled by controller 340. Controller 340 instructs driver 330 to generate the appropriate signals to operate motor 310. Controller 340 determines system level operation parameters, such as, when the motor will starts to move the object?, for how long in time and in which velocity motor works?, what will be object displacement?, etc. Typically, controller 340 is implemented as a digital micro controller with a processor, memories and peripherals and it is running embedded software on it.

Other subsystems 350 may include additional processors, one or more sensors, power subsystem, communication subsystem and any other modules such as additional MEMS elements, electrical circuitries, and subsystems that are related to the objectives of motor system 300. Optionally, power subsystem contains battery. Optionally, power subsystem contains rechargeable battery. Optionally, power subsystem contains charger. Optionally, power subsystem contains wireless charger. Optionally, power subsystem contains power port for external power source. Optionally, power subsystem contains energy convertor that harvest energy from the environment to power the system or charge power subsystem batteries.

The communication subsystem enables communication with other adjacent systems. Communication media may be wireless or wired. Communication subsystem nay be connected to controller 340. Communication subsystem is optionally connected to a smartphone. Communication subsystem is optionally connected to the cloud. Controller 340 may get instructions from outside on the preferred way to operate the motor 310.

In an exemplary embodiment of the invention, system 300 comprises one or more dies as illustrated the Figure. Motor 310 is fabricated on a die 360. Object 320 is optionally fabricated on the same die, i.e., die 360, or alternatively on independent die, die 360a. Driver 330 is optionally fabricated on the same die, i.e., die 360, or alternatively on independent die, die 360b. Controller 340 is optionally fabricated on the same die, i.e., die 360, or alternatively on independent die, die 360b. In an exemplary embodiment of the invention, motor 310, object 320, driver 330 and controller 340 are integrated on the same die, a complete motor system in a single die is fabricated. Optionally, any combination of modules from 310-350 may be implemented as a single die and the other module may be implemented in another die to create a two die solution.

In an exemplary embodiment of the invention, motor 310, and optionally, object 320 and other MEMS related subsystem are fabricated on a first die and driver 330, controller 340, other subsystem 350 and other electrical circuitries are fabricated in a second die. The first die and the second die are fabricated on a first wafer and a second wafer and are bonding to each other to create one integrates wafer that is ten cut to dies. The electric signals between the first (MEMS) die and the second (ELECTRIC) die are carried by through-dies conducting vias. This process provide affectively a single die for the full system. Yet, in another exemplary embodiment of the invention, the motor is fabricated in a first die (or wafer), the object is fabricated in a second die (or wafer) and bonded on top of the first die (or wafer), and the rest of the system is fabricated on a third die (or wafer) bonded onto the bottom of the first die (or wafer).

Optionally, the system has a package 370. Package 370 may be a multi-chip-module (MCM) that assemble the different dies 360 and any combination of 360a-360d to a single package.

In an exemplary embodiment of the invention, the plurality of motors and the plurality of objects may be associated to each other by any one of or a combination of one to one, one to many and many to one relationships. Similarly, the plurality of drivers and the plurality of motors may be associated to each other by any one of or a combination of one to one, one to many and many to one relationships.

Reference is made now to FIG. 5. FIG. 5 illustrates a top view of varies shape of beam 50 in accordance with the present invention. Beam 50a is identical to the beam illustrated in FIGS. 1A-2B and it shape is a simple curved shape. Beam 50b is constructed from three straight segments the central segment is straight and tangent to the object surface. Beam 50c is constructed form five segment the $1^{st}$, $3^{rd}$, and $5^{th}$ are straight and tangent to the object surface while segment $2^{nd}$ and $4^{th}$ are tilted and during beam bent do their angle is changed and the difference in their tilt provide the displacement change of the central ($3^{rd}$) segment. Beam 50d is constructed from three segments the central ($2^{nd}$) segment is straight and tangent to the object surface while the outer ($1^{st}$ and $3^{rd}$) segments are curvy. the outer ($1^{st}$ and $3^{rd}$) segments are bent towards the object when the beam pressed from the edges. Beams 50e and 50f are constructed from yet another two types of shapes of curves. While the width of beams 50a-50f are kept constant, beam 50g and 50h are with variable beam width. Beam 50g is constructed from five segments. The $1^{st}$ and the $5^{th}$ segments are just for connecting to the beam holders. Between the $1^{st}$ and the $2^{nd}$ segments and between the $4^{th}$ and the $5^{th}$ segments there is a small narrowing that act as a joint and allow the $2^{nd}$ and $4^{th}$ segments to tilt and produce the desired displacement of the central $3^{rd}$ segment. the $2^{nd}$ and $4^{th}$ segments are relatively thick so they less flexible to bent. The central $3^{rd}$ segment is curved and thinner to have enough flexibility to match the object surface. Beam 50h is constructed from five thick segments separated by four thinner beam segments. The thinner segments act as a joins effectively allows the $2^{nd}$ and $4^{th}$ segments to change its tilt relative to $1^{st}$, $3^{rd}$ and $5^{th}$ segments. While $1^{st}$, $3^{rd}$ and $5^{th}$ kept tangent to the object the $2^{nd}$ and $4^{th}$ segments tilt increase for producing a displacement towards the object of the central $3^{rd}$ segment of beam 50h. All shapes of beam 50a-50h as well as many more essentially do the job and can be used. It is apparent that those skilled in the art can fit the optimal shape by simulation or calculation with respect to the actual material used and the fabrication constrains. In addition to the longitudinal shape of the beam, the shape off the cross section of the beam as can be seen by cutting the beam, for example, across line A-A of Beam 50h may varies too.

Reference is made now to FIG. 6. FIG. 6 illustrates a cross-sectional view of the varies cross-section shapes of beam 50. The simplest cross-sectional view is illustrated in beam cross-section 51a. This cross-section 51a is rectangular and it in use in most cases. beam cross-section 51b and beam cross-section 51c are typically generated by fabrication effects and sometime deliberately made to match the object surface. Beam cross-section 51d and beam cross-section 51e may be used if it is desire to press the object harder in the center or the edges respectively. In the case of beam cross-section 51f the roughness of the beam surface is set to meet the object roughness surface.

The type of actuation of the beam actuators may be varied. Many types of MEMS actuators can be used to move the holders. The most common options are electro-static, electro-magnetic, thermal and piezoelectric.

Figure 7:
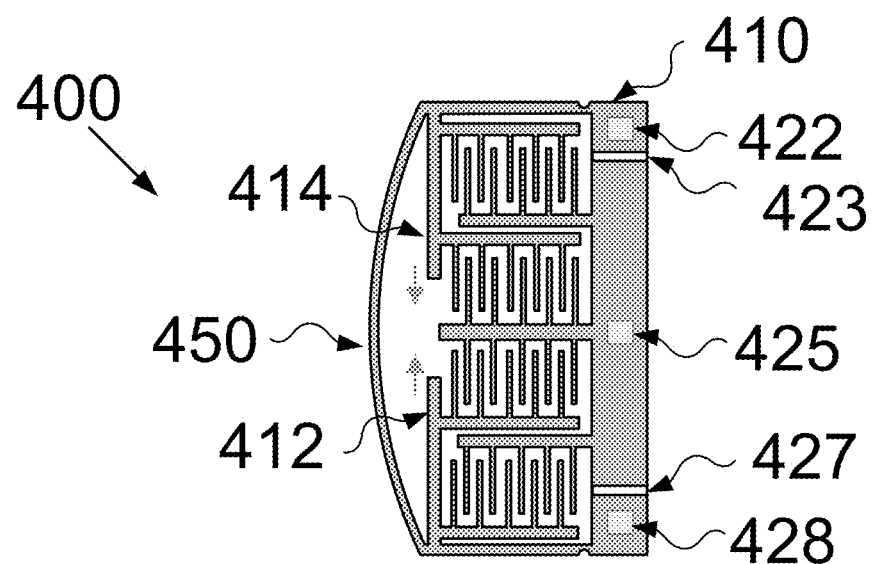
FIG. 7 is a top view of a beam actuator with an exemplary embodiment of an electro-static actuation.

Reference is made now to FIG. 7. FIG. 7 is a top view of beam actuator 400 illustrating an exemplary embodiment of an electro-static actuation. Beam actuator 400 comprises beam 450 and frame 410. Inside frame 410 there are four sections of electrostatic comb actuators. One side of each one of the four comb actuator is attached to the fixed base of the beam actuator, and the other side of each one of the four comb actuator is attached to two arms 412 and 414. Arm 412 is connected to the lower edge of beam 450 and to the two lower comb actuators. Arm 414 is connected to the upper edge of beam 450 and to the two upper comb actuators. The frame, arms and the comb actuators are all made up of conducting metrical, for example doped polysilicon. Two isolating elements 423 and 427 are provided to electrically separate between the fingers of each side of the comb actuators. For example these isolating elements may be made by doping the area of the isolating elements 423 and 427 in such a way that two back to back diodes will be formed. Alternatively, an isolation material, such as silicon oxide, is fabricated to form the isolating elements 423 and 427. Appling a voltage between contact 425 and contact 428 will pull arm 412 upwards by the two lower comb actuators as indicated in the grey arrow drawn near arm 412. Similarly, applying a voltage between contact 422 and contact 425 will pull arm 414 downwards by the two upper comb actuators as indicated in the grey arrow drawn near arm 414. As the two arms 412 and 414 are pulled to each other beam 450 is bent and move leftwards.

Figure 8:
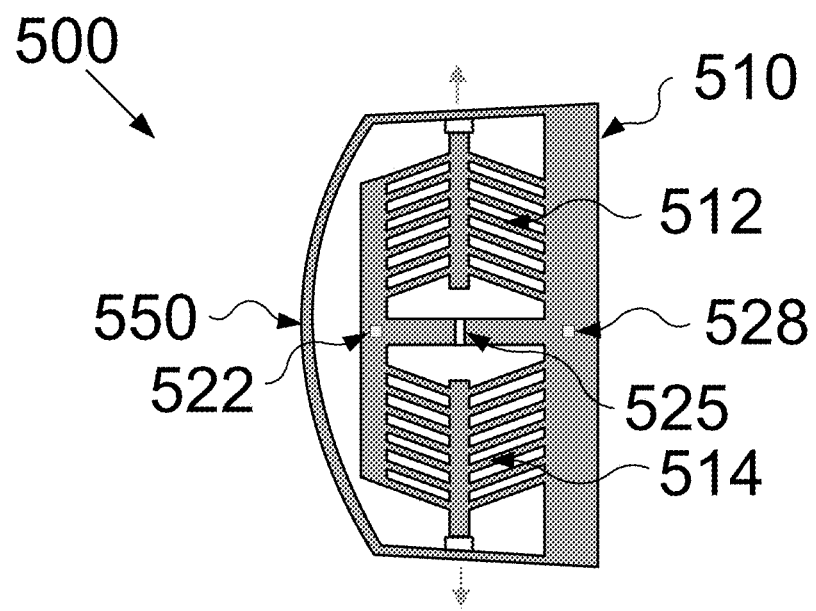
FIG. 8 is a top view of a beam actuator with an exemplary embodiment of a thermal actuation.

Reference is made now to FIG. 8. FIG. 8 is a top view of beam actuator 500 illustrating an exemplary embodiment of a thermal actuation.

Beam actuator 500 comprises beam 550 and frame 510. Inside frame 510 there are two sections of chevron thermal actuators 512 and 514. chevron thermal actuators 512 pushes the upper edge of beam 550 upwards and chevron thermal actuators 514 pushes the lower edge of beam 550 downwards. The frame 510, and the thermal actuators are made up of conducting metrical that heated and expand when current flow inside the conducting metrical. For example frame and chevron thermal actuators are made of doped poly-silicon. Isolating element 525 is provided to electrically separate between the sides of the chevron thermal actuators. For example this isolating element may be made by doping the area of the isolation elements 525 in such a way that two back to back diodes will be created. Alternatively, an isolated material such as silicon oxide is fabricated to form the isolating element 525. Appling a voltage between contact 522 and contact 528 will drive current through the chevron thermal actuators that will push the frame outwards indicated in the grey arrows and hence stretch beam 450 and move it rightwards to release its grip from the object.

Beam actuator 400 in the above exemplary embodiment is from the type illustrated in FIG. 1A. Beam actuator 500 in this exemplary embodiment is from the type illustrated in FIG. 2A. However, with the necessary modification or changes the other beam actuator types may be formed.

Figure 9:
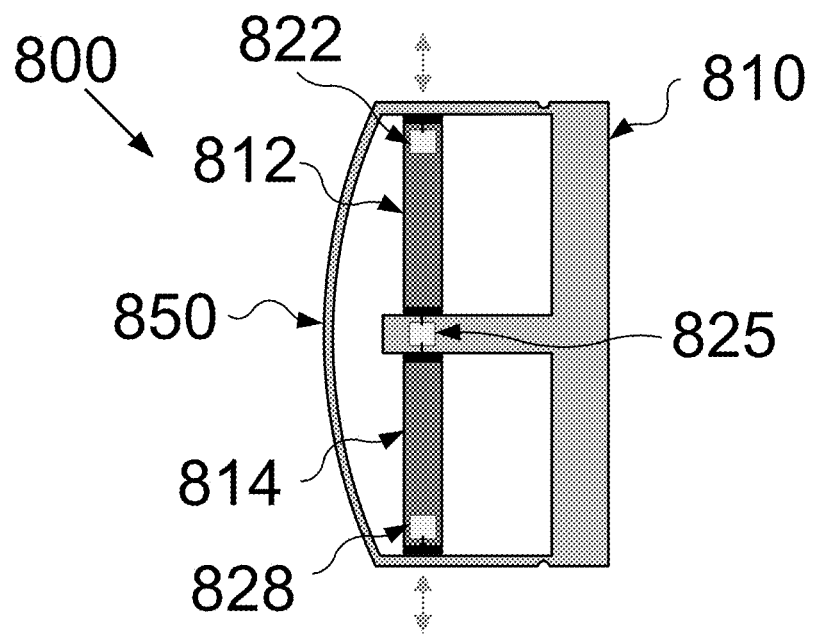
FIG. 9 is a top view of a beam actuator with an exemplary embodiment of a piezoelectric actuation.

Reference is made now to FIG. 9. FIG. 9 is a top view of beam actuator 800 illustrating an exemplary embodiment of a piezoelectric actuation. Beam actuator 800 comprises beam 850 and frame 810. Inside frame 810 there are two sections of piezoelectric crystals actuators 812 and 814. Each one of piezoelectric crystals 812 and 814 has two electrodes. Each one of piezoelectric crystals 812 and 814 can contract or expand depending on the polarity of the voltage applied. The voltage to the electrodes supplied from contacts 822, 825 and 828. Contact 825 is common contact, contact 822 drive the top actuator 812, and contact 828 drive the bottom actuator 814.

Driving the piezoelectric crystals actuators 812 and 814 will push or pull beam 850 edges as illustrated by the grey arrows and hence bent or stretch beam 850 and move it either rightwards or leftwards. Beam actuator 800 in this exemplary embodiment can act both as the beam actuator type illustrated in FIG. 1A and in FIG. 2A. To increase the displacement of piezoelectric crystals actuators 812 and 814 one may modify them to a piezoelectric stack actuator as demonstrated next.

Figure 10:
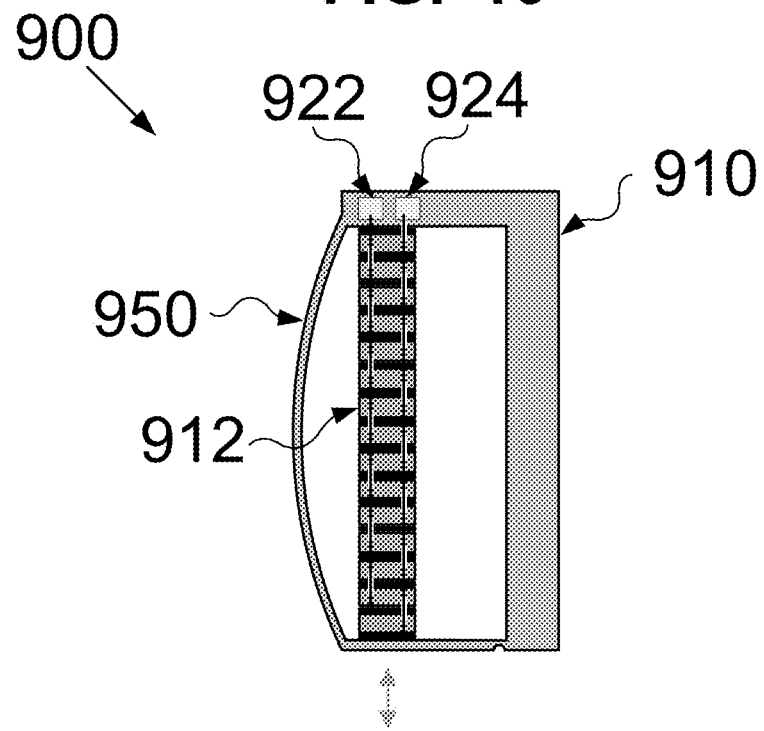
FIG. 10 is a top view of a beam actuator with another exemplary embodiment of a piezoelectric actuation.
Figure 11:
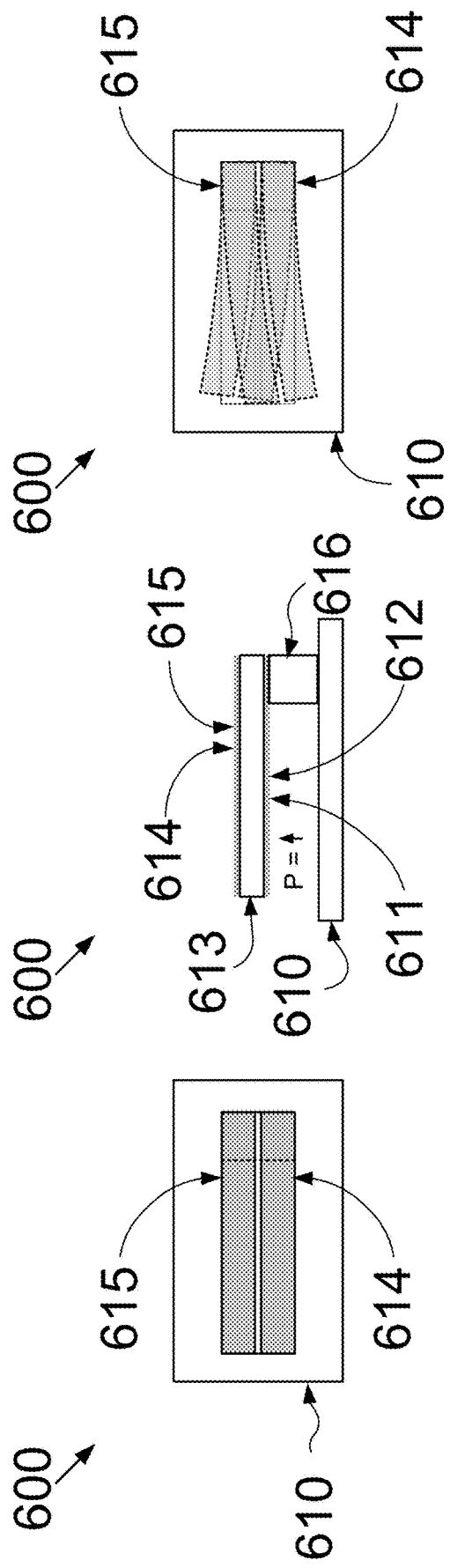
FIG. 11A-FIG. 11C are illustrations of a piezoelectric cantilever bending in plane parallel to a substrate plane beams in accordance with the present invention.

Reference is made now to FIG. 10. FIG. 10 is a top view of beam actuator 900 illustrating another exemplary embodiment of a piezoelectric actuation. Beam actuator 900 comprises beam 950 and frame 910. Inside frame 910 there is piezoelectric stack actuators 912. Stack actuator 912 is built from fifteen piezoelectric tiles with an electrode between every two adjacent piezoelectric tiles. This construction allows a fifteen time larger displacement for the same applied voltage. Piezoelectric stack actuators 912 is driven from contacts 922 and 924. The connection between the contacts and the electrode is such that one electrode is connected to the even electrodes and the other contact is connected to the odd electrodes. In this configuration, with the proper polarization, all tiles contract or expand simultaneously to the same direction.

Driving the piezoelectric stack actuators 912 will push or pull beam 950 bottom edge as illustrated by the grey arrow and hence bent or stretch beam 950 and move it either rightwards or leftwards. Beam actuator 900 in this exemplary embodiment can act both as the beam actuator type illustrated in FIG. 1B and in FIG. 2B.

Another way to increase the displacement in piezoelectric actuators is to use piezoelectric cantilever as described next.

Reference is now made to FIGS. 11A-11C. FIGS. 11A-11C illustrate a piezoelectric cantilever 600 bending in plane parallel to a substrate plane. FIG. 11A is a top view of piezoelectric cantilever 600. Piezoelectric cantilever 600 is built on top of a substrate 610. From top view only top electrodes 614 and 615 are visible. FIG. 11B is a side view of piezoelectric cantilever 600. Piezoelectric cantilever 600 is fabricated over anchor 616 that is connected to substrate 610. Piezoelectric cantilever 600 has three layers: bottom electrodes 611 and 612, piezoelectric layer 613, and top electrodes 614 and 615. The polarization of the piezoelectric layer 613 are perpendicular to substrate 610 plane. FIG. 11C is a top view of piezoelectric cantilever 600. In FIG. 11C the dynamics of the bending of cantilever 600 when electric signal is driven to the cantilever is illustrated. Cantilever 600 bends in parallel to substrate 10 plane. If the voltage between electrodes 611 and 614 is positive and the voltage between electrode 612 and 615 is negative, one side of the cantilever contracts while the other side of the cantilever expands. Consequently, cantilever 600 bents. In an exemplary embodiment of the invention, electrodes 611 and 612 are connected together or fabricated as a double width single electrode. Alternatively, electrodes 614 and 615 are connected together or fabricated as a single electrode.

Figure 12:
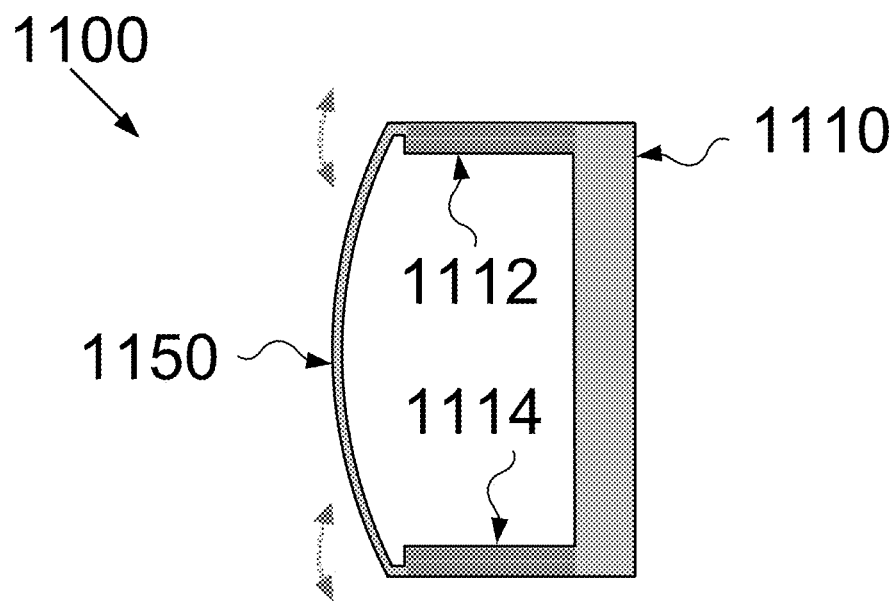
FIG. 12 is a top view of a beam actuator illustrating an exemplary embodiment of piezoelectric cantilever actuation for a beam actuator.

Reference is made now to FIG. 12. FIG. 12 is a top view of beam actuator 1100 illustrating an exemplary embodiment of piezoelectric cantilever actuation for a beam actuator. Beam actuator 1100 comprises beam 1150 and frame 1110. The frame and the beam are made of a single piece of piezoelectric material. On the top and bottom sides arms of frame 1110, an electrodes are fabricated to form cantilevers 1112 and 1114. Piezoelectric cantilevers 1112 and 1114 have two electrodes in the visible side of the drawing and another common electrode hidden below the view (under the cantilever). Each cantilever may bent inwards or outwards as illustrated by the two way grey arrows left to the tip of the cantilevers. When both piezoelectric cantilever actuators bent inwards, beam 1150 will bent outwards relative to frame 1110 and when both piezoelectric cantilever actuators bent outwards, beam 1150 will stretch towards frame 1110. This embodiment is very simple but suffers from two drawbacks: First, the area inside the frame is not used to increase the power of the actuation, and second, having the beam made from piezoelectric material may not be the optimal choose from flexibility and durability point of views. Another embodiment that address these drawbacks.

Figure 13:
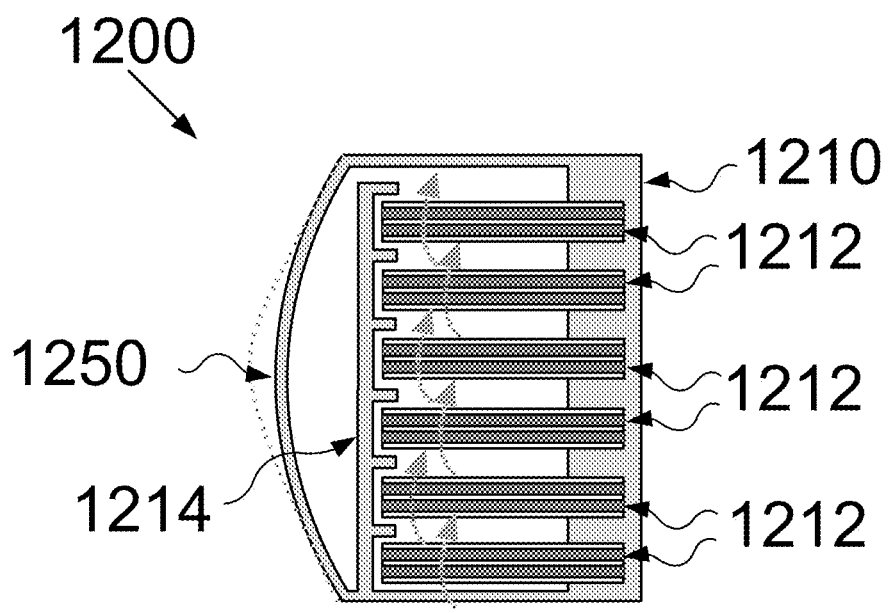
FIG. 13 is a top view of beam actuator illustrating another exemplary embodiment of piezoelectric cantilever actuation for a beam actuator.

Reference is made now to FIG. 13. FIG. 13 is a top view of beam actuator 1200 illustrating another exemplary embodiment of piezoelectric cantilever actuation for a beam actuator. Beam actuator 1200 comprises beam 1250 and frame 1210. The frame holds six piezoelectric cantilevers 1212. The cantilevers 1212 are made from piezoelectric material while the frame is made from another material. In an exemplary embodiment of the invention, the frame made of metal, e.g. from aluminum. Any other material may be used as well to meet the mechanical requirements of the beam. In an exemplary embodiment of the invention, the piezoelectric cantilevers pattern is fabricated by etching a layer of piezoelectric material over a substrate and the other material pattern is made by deposition over mask using lithography followed by lift-off process. The area inside frame 1210 is used to insert as much as possible cantilevers and the power of the cantilever is summed up using an arm 1214 comprising teeth. piezoelectric cantilevers are bent towards the teeth and push arm 1214 upwards. As a result, arm 1214 push beam 1250 so that it bent upwards relative to frame 1210 as illustrated by the grey dotted line in the figure.

The type of this beam actuator is classified as the same type as the beam actuator in FIG. 1B.

In an exemplary embodiment of the invention, for providing better force transmission between the cantilevers and the beam, cantilevers 1214 and arm 1214 are made from same piezoelectric materials and the teeth are tilted towards and connected to the cantilevers to transmit the bending force to arm 1214. Arm 1214 is connected to frame 1210 and beam 1250 that made from different material using another tight hard connection or a joint.

Figure 14A:
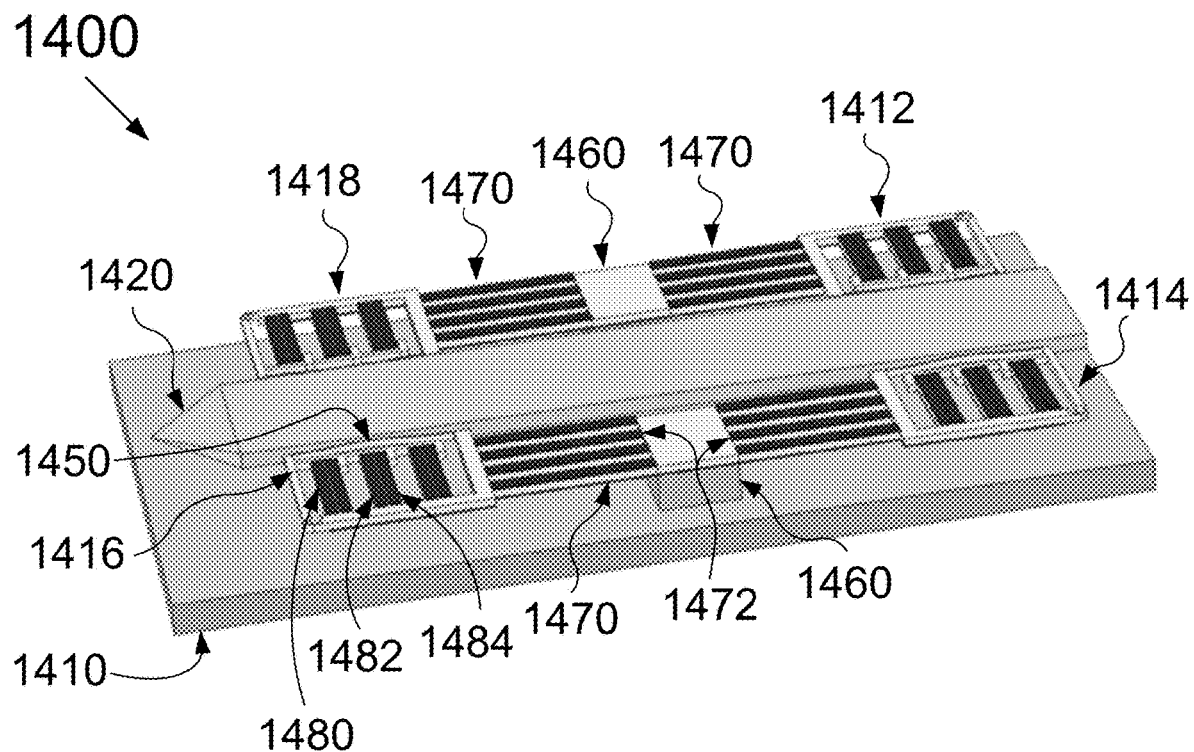
FIG. 14A-FIG. 14B are isometric views of an embodiment of a full version of a linear step motor moving a needle in accordance with an exemplary embodiment of the invention.
Figure 14B:
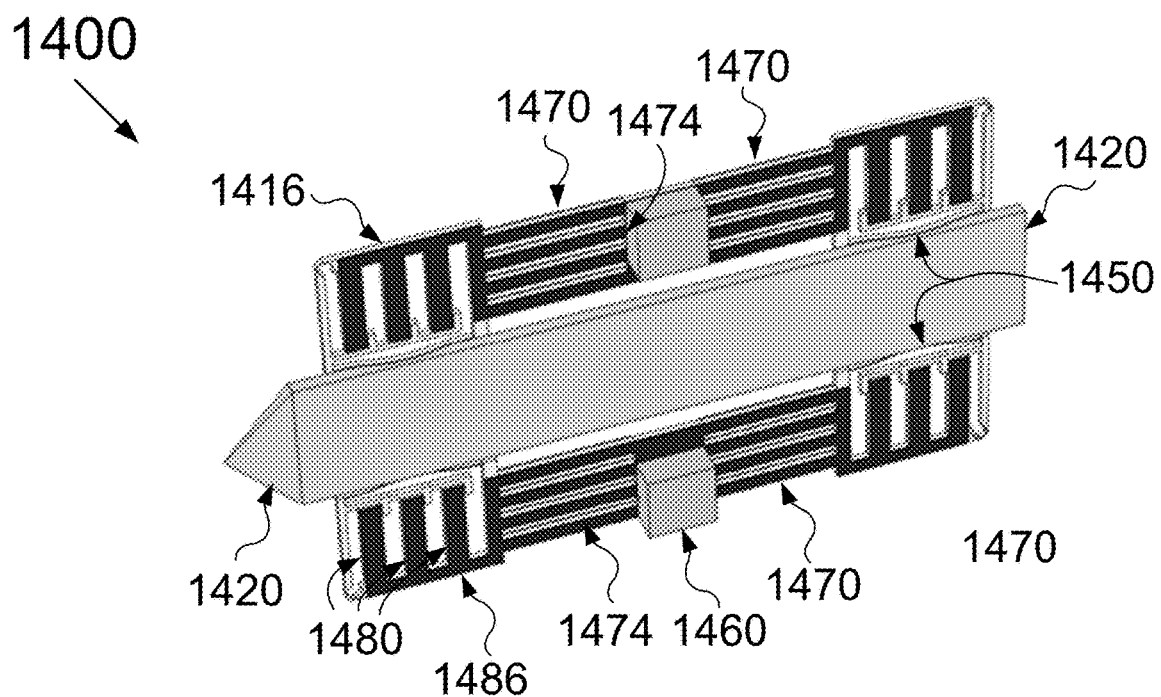

Reference is made now to FIG. 14A and FIG. 14B. FIG. 14A and FIG. 14B are isometric views of an embodiment of a full version of a linear step motor moving a needle in accordance with an exemplary embodiment of the invention. Step motor 1400 comprises four beam actuators 1412, 1414, 1416 and 1418 which are similar to the beam actuators 1200 illustrated in FIG. 13. FIG. 14A is an isometric view from top left side and FIG. 14B is an isometric view from bottom right side. In FIG. 14B substrate 1410 is removed from the figure so it will not hide the details of step motor 1400. Two anchors 1460 are connected to substrate 1410. Each anchor 1460 is connected to two auxiliary actuators 1470. The four auxiliary actuators 1470 are connected each to one of beam actuator 1412, 1414, 1416 or 1418. Each auxiliary actuators 1470 is made of four piezoelectric crystals shaped as elongated bars. Each bar has top electrode 1472 on the top side of the bar, and bottom electrodes 1474 on the bottom side of the bar. bottom electrodes 1474, in this case is part of a common ground plane cover all the bottom electrodes of both auxiliary actuators and beam actuators. When a voltage applied to electrodes 1472 and 1474 the bars contract or expand so that auxiliary actuators 1470 move beam actuators 1412, 1414, 1416 and 1418 along the longitude axis of a needle 1420 (the needle, in this case, is the movable object of the linear step motor 1400). Each beam actuator 1412, 1414, 1416 or 1418 as a beam 1450 and three piezoelectric cantilevers 1480. Each cantilever 1480 have two electrodes 1482 and 1484 on the top side and one electrode 1486 on the bottom side. Electrode 1486 is part of one metal layer that form common ground plane cover all the bottom electrodes including electrodes 1474 of the auxiliary actuators. The description of the operation of beam actuators 1412, 1414, 1416 and 1418 is similar to the description of the embodiment of FIG. 13 and the description of the operation of step motor 1400 is similar to the description of the step motor embodiment of FIG. 3A.

Fabrication Process

The method of fabricating of some embodiment of the step motor that comprises the substrate, one or more objects, one or more anchors and one or more beam actuators comprises the steps of:
(1) depositing sacrificial layer over the substrate;
(2) depositing conducting layer over the sacrificial layer;
(3) depositing piezoelectric layer over the conducting layer;
(4) etching a geometric pattern of the one or more actuators using a first mask created by lithography process;
(5) depositing the one or more objects and one or more anchors using a second mask created by lithography process and a lift-off process; and
(6) etching the sacrificial layer under the needle and the one or more piezoelectric actuators.

The process fabricate a device wherein the anchors are configured to connect the substrate to the actuators and the one or more beam actuators are configured to move the one or more objects.

Alternatively, the step of deposition of the sacrificial layer may be omitted and instead etching of the top surface of the substrate may be done using SCREAM process. The etching of top surface of the substrate is done under the needle and the one or more actuators. First, a vertical anisotropic dry etching of pattern of pores is performed. Second, etching horizontal extension of the pores using wet or gas etching, is performed.

Figure 15A:
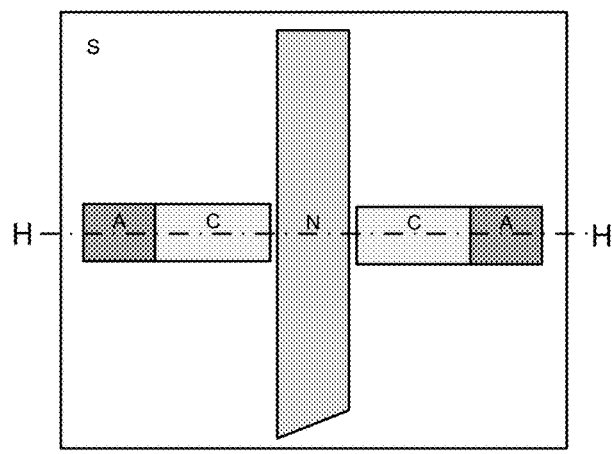
FIG. 15A-FIG. 15L are illustrations of the process to fabricate an exemplary piercing apparatus in accordance with some embodiments of the present invention.

To describe the fabrication process in more details we take for example the step motor embodiment of FIG. 14. To simplify the process explanations and illustration we locate a cantilever and anchor un the same plane so it will be easier to explain the fabrication process in a single step by step cross-sectional views. The top view of the conceptual modified design is given in FIG. 15A. FIG. 15A illustrates a substrate, designated by S, two anchors, designated by A, a needle, designated by N, and two piezoelectric cantilevers with top and bottom electrodes designated by C. The fabrication process will be illustrated by a cross-sectional views across line H-H.

Figure 15B:
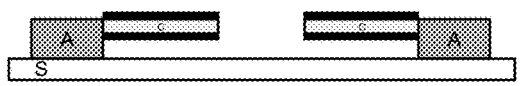

Reference is now made to FIG. 15B. FIG. 15B illustrate a cross-sectional view of the desired final stage of fabrication. In the final stage only anchors A are connected to substrate S. the piezoelectric cantilevers C are connected to anchors A. On top and below the piezoelectric material of cantilever C there is metal electrodes (in black in the figure). The needle is free from substrate S and held by the cantilevers C.

Figure 15C:
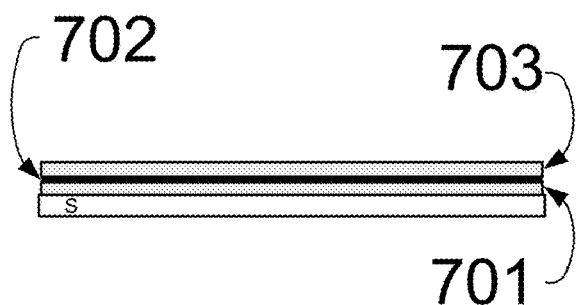

Reference is now made to FIG. 15C. FIG. 15C illustrate the first stage of fabrication. In this stage the substrate S, typically come in the shape of a round wafer, is covered with three layers: the first layer is sacrificial layer 701, typically made of silicon oxide (SOX). The second layer 702 is a conducting layer, e.g., metal layer. The third layer 703 is a piezoelectric layer, e.g., made from PZT material. Piezoelectric layer 703 is sintered and polled to have crystal polarization perpendicular to the substrate plane in this stage. Typically a plurality of chips are made from a single wafers and the processes that are herein below are done simultaneously to a plurality of chips or dies on the wafer and the chips are cut off to separate chips in the final stage.

Figure 15D:
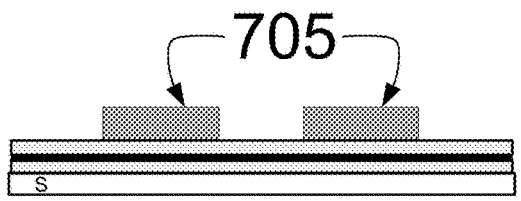

Reference is now made to FIG. 15D. FIG. 15D is the second stage of fabrication. In this stage photoresist material is deposited on the wafers, a mask with a geometric 2D pattern is made, a photolithography followed be a development process and clearing of the developed photo resist, hereinafter lithography stage, performed and the final 2D photo resist 705 mask is deployed over the wafer. The 2D pattern, in this case, is the pattern of the cantilevers.

Figure 15E:
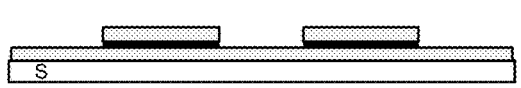
Figure 15F:
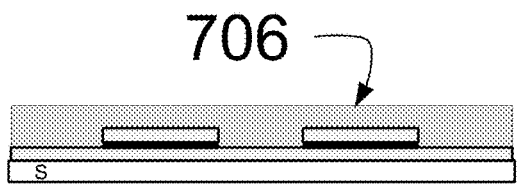

Reference is now made to FIG. 15E. FIG. 15E is a third stage of the fabrication. Using the photoresist mask the areas that are not part of the cantilevers are etched away, The etched is stopped at the sacrificial layer that is not sensitive to the specific agent used in this attaching process. No we have the cantilevers Reference is now made to FIG. 15F. FIG. 15F is a fourth stage of the fabrication. Another thick photoresist layer is spread over the wafer. This layer of photoresist covers the existing cantilever pattern.

Figure 15G:
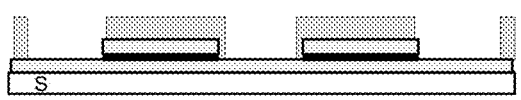

Reference is now made to FIG. 15G. FIG. 15G is a fifth stage of the fabrication. In this stage another lithography process is made to expose the area to fabricate the needle and the anchors.

Figure 15H:
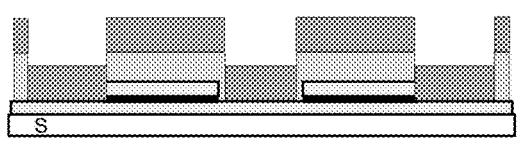

Reference is now made to FIG. 15H. FIG. 15H is a sixth stage of the fabrication. In this stage the needle and the anchors are fabricated in a process called deposition. Since the deposition is done over the mask part of the material of this layer is deposited over the sacrificial layer while other part of the material of this layer are deposited over the photoresist mask.

Figure 15I:

Reference is now made to FIG. 15I. FIG. 15I is a seventh stage of the fabrication. In this stage we clean the photoresist layer so every material of the layer that was over the photoresist layer is cleared away too. This process is known in the art as lift-off process.

Figure 15J:

Reference is now made to FIG. 15J. FIG. 15J is an eighth stage of the fabrication. In this stage deposit the top electrodes and metal connection. This process involved a lithography and metal deposition and, optionally, one or more isolator layers and additional metal layers.

Figure 15K:

Reference is now made to FIG. 15K. FIG. 15K is a ninth stage of the fabrication. In this stage etching the sacrificial layer is done. This stage will free the needle and cantilever from the actuator. Etching is done through the opening in on the edges of the needles and actuator (the openings cannot be seen clearly on the cross sectional view but are more noticeable in 3D top view). The area under the anchor is partially etched away too but since the aching time is controlled a significant area under the anchor is not etched to and allow the anchoring function of the anchor.

At this stage we have a chip functionally similar to the desired one represented in FIG. 15B. After this stage additional stages such as cutting the wafer to die and packaging is performed.

Figure 15L:
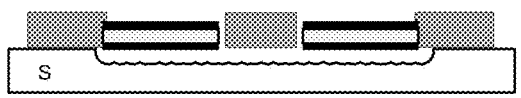

Reference is now made to FIG. 15L. FIG. 15L is an alternative process that use the substrate as a sacrificial layers. All steps are similar to the above but the last etching is done over the substrate with a process known as SCREAM. In SCREAM process the etch is done using pattern of pores on the area that we going to etch the substrate. The etching begin with anisotropic dry etching to penetrate vertically the silicon substrate with the specific pore pattern then extend the etching horizontally by isotropic wet/gas phase etching. The cross-sectional view of this process after the SCREAM process is illustrated in FIG. 15L.

The above describe fabrication process comprises only the conceptual major process stages and many other steps and stages are involved in each stage and between steps. The order of some steps may be changed and it is evident that many alternatives, modifications and variations will be apparent to those skilled in the art.

Deposition steps may be done by varies types of chemical vapor deposition (CVD), evaporation, sputtering, physical vapor deposition (PVD), Atomic layer deposition (ALD), electrochemical deposition (ECD), and the like. Etching can be dry etching, atomic layer etching (ALE), Wet etching, Plasma etching, and the like. Other process may include thermal treatments, Chemical-mechanical polishing (CMP) and the like.

Applications

As shown in FIG. 14, the step motor may be used for moving a needle. One application of moving a needle or a micro-needle is hypodermal treatment. Other applications for needles may be in manufacturing or biological lab tests. The rotary step motor may be used for miniature data storage disks.

In an exemplary embodiment of the invention the object that is treated by the step motor object is an article of manufacturing and the object is used for manipulating or piercing the object during the process of the manufacturing.

In an exemplary embodiment of the invention the object that is treated by the step motor object is a lab object-under-test or a biological organ and the step motor is used for testing or measuring or manipulating the lab object-under-test or the biological organ.

It is expected that during the life of a patent maturing from this application many relevant applications will be developed and the scope of the implementation is intended to include all such new technologies a priori.

The terms "comprises", "comprising", "includes", "including", "having" and their conjugates mean "including but not limited to".

The term "consisting of means "including and limited to".

As used herein, the singular form "a", "an" and "the" include plural references unless the context clearly dictates otherwise. For example, the term "an element" or "at least one element" may include a plurality of elements, including mixtures thereof.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A step motor for moving an object comprising:
one or more beam actuators; and
one or more auxiliary actuators,
each beam actuator comprises:
(a) a flexible beam;
(b) two holders holding the beam from the beam edges; and
(c) an actuator for moving said at least one holder in order to bent the beam toward the object or to pull the beam away from the object,
wherein the one or more axillary actuators are connected to the one or more beam actuators, the one or more beam actuators configured to grip or release the object, and
the one or more beam actuators perform a movement step to the object by first grip the object by the one or more beam actuators then push the object by activating the auxiliary actuator.

2. The step motor of claim 1, wherein said actuator is configured to move both holders.

3. The step motor of claim 1, wherein the step motor is linear step motor.

4. The step motor of claim 1, wherein the step motor is rotary step motor.

5. The step motor of claim 1, wherein the object is a needle.

6. The step motor of claim 1, wherein the step motor is fabricated on a die.

7. The step motor of claim 1, wherein a plurality of said step motors are fabricated on a single die.

8. The step motor of claim 6, wherein the object is further fabricated on said die.

9. The step motor of claim 1, wherein the step motor further comprises one or more drivers that drives electrical signals to activate the actuator.

10. The step motor of claim 9, wherein the step motor further comprises a controller, wherein the controller command the drivers and activate the beam actuators and the auxiliary actuators in a sequence of commands that is suitable to move the object.

11. The step motor of claim 9, wherein the step motor is fabricated on a first die, and the controller and the one or more drivers are fabricated on a second die and the dies are bonded back to back to each other by wafer bonding technics.

12. The step motor of claim 11, wherein the second die comprises at least on of or the combination of (1) sensors, (2) power subsystem, and (3) communication subsystem.

13. The step motor of claim 1, wherein the beam comprises from a plurality of straight segments.

14. The step motor of claim 1, wherein the beam cross section shape is not rectangular.

15. The step motor of claim 1, wherein the actuator of the beam actuator is any one of or any combination of (1) electro-static actuator, (2) electro-magnetic actuator, (3) thermal actuator, and (4) piezoelectric actuator.

16. The step motor of claim 1, wherein the axillary actuator is comprises of any one of or any combination of (1) electro-static actuator, (2) electro-magnetic actuator, (3) thermal actuator, and (4) piezoelectric actuator.

17. The step motor of claim 1, wherein the actuator of the beam actuator comprises one or more piezoelectric cantilevers.

18. The step motor of claim 1, wherein the step motor comprising a layer of piezoelectric material with electrodes above and below said layer.

19. The step motor of claim 1, wherein the step motor is fabricated by a method comprising:
    (1) deposit sacrificial layer over a substrate;
    (2) deposit conducting layer over the sacrificial layer;
    (3) deposit piezoelectric layer over the conducting layer;
    (4) etch a geometrical pattern of the one or more beam actuators and one or more auxiliary actuator using a mask created by lithography process; and
    (5) etch the sacrificial layer under one or more one or more beam actuators and one or more auxiliary actuator.

20. The step motor of claim 1, wherein the step motor is fabricated by a fabricating method comprising:
    (1) deposit piezoelectric layer;
    (2) etch a geometrical pattern of the one or more beam actuators and one or more auxiliary actuator using a mask created by lithography process; and
    (3) etch the top surface of the substrate under the one or more beam actuators and one or more auxiliary actuator using a two stage SCREAM etching process comprising: first, vertical anisotropic dry etching of pattern of pores, and second, horizontal extension of the pores etching using wet or gas etching.

* * * * *